United States Patent
White et al.

(10) Patent No.: US 12,362,716 B2
(45) Date of Patent: Jul. 15, 2025

(54) PARAMETRIC TRAVELING WAVE AMPLIFIER FOR QUBITS

(71) Applicant: Google LLC, Mountain View, CA (US)

(72) Inventors: Theodore Charles White, Santa Barbara, CA (US); Anthony Edward Megrant, Goleta, CA (US)

(73) Assignee: Google LLC, Mountain View, CA (US)

( * ) Notice: Subject to any disclaimer, the term of this patent is extended or adjusted under 35 U.S.C. 154(b) by 468 days.

(21) Appl. No.: 17/632,923

(22) PCT Filed: Aug. 3, 2020

(86) PCT No.: PCT/US2020/044743
§ 371 (c)(1),
(2) Date: Feb. 4, 2022

(87) PCT Pub. No.: WO2021/026070
PCT Pub. Date: Feb. 11, 2021

(65) Prior Publication Data
US 2022/0311400 A1    Sep. 29, 2022

Related U.S. Application Data

(60) Provisional application No. 62/882,929, filed on Aug. 5, 2019.

(51) Int. Cl.
*H03F 7/00* (2006.01)
*H01P 3/00* (2006.01)
(Continued)

(52) U.S. Cl.
CPC .............. *H03F 7/00* (2013.01); *H01P 3/003* (2013.01); *H03F 19/00* (2013.01); *H10N 60/0912* (2023.02); *H10N 69/00* (2023.02)

(58) Field of Classification Search
CPC .............. H03F 7/03; H03F 19/00; H01P 3/003
(Continued)

(56) References Cited

U.S. PATENT DOCUMENTS

2018/0322408 A1* 11/2018 Chen et al. .......... H10N 60/805
2022/0052662 A1*  2/2022 White et al. .......... H03H 11/04

FOREIGN PATENT DOCUMENTS

JP    2009-225213    10/2009
JP    2010-068313     3/2010
(Continued)

OTHER PUBLICATIONS

Office Action in Korean Appln. No. 10-2022-7006391, dated Jul. 28, 2023, 20 pages (with English translation).
(Continued)

*Primary Examiner* — Benny T Lee
(74) *Attorney, Agent, or Firm* — Fish & Richardson P.C.

(57) ABSTRACT

A parametric traveling wave amplifier (200) is disclosed in which the amplifiers include: a co-planar waveguide, in which the co-planar waveguide includes at least one Josephson junction (210) interrupting a center trace (204) of the co-planar waveguide; and at least one shunt capacitor coupled to the co-planar waveguide, in which each shunt capacitor of the at least one shunt capacitor includes a corresponding superconductor trace (214) extending over an upper surface of the center trace of the co-planar waveguide, and in which a gap separates the superconductor trace from the upper surface of the center trace, and in which the co-planar waveguide including the at least one Josephson junction and the shunt capacitor establish a predefined overall impedance for the traveling wave parametric amplifier.

18 Claims, 11 Drawing Sheets

(51) Int. Cl.
  *H03F 19/00* (2006.01)
  *H10N 60/01* (2023.01)
  *H10N 69/00* (2023.01)

(58) Field of Classification Search
  USPC .................................. 330/4.6; 333/238, 99 S
  See application file for complete search history.

(56) References Cited

FOREIGN PATENT DOCUMENTS

| | | |
|---|---|---|
| JP | 2013-033797 | 2/2013 |
| JP | 2017-533572 | 11/2017 |
| WO | WO 2020/152393 | 7/2020 |

OTHER PUBLICATIONS

Chaudhuri et al., "Broadband parametric amplifiers based on nonlinear kinetic inductance artificial transmission lines," Applied Physics Letters, Feb. 2017, 110:152601-1.

International Preliminary Report on Patentability International Appln. No. PCT/US2020/044743, dated Feb. 8, 2022, 6 pages.

International Search Report and Written Opinion in International Appln. No. PCT/US2020/044743, dated Nov. 23, 2020, 10 pages.

White et al., "Traveling wave parametric amplifier with Josephson junctions using minimal resonator phase matching," Applied Physics Letters, Mar. 2015, 106:242601-1 to 242601-5.

Zorin, "Josephson Traveling-wave parametric amplifier with three-wave mixing," CoRR, Feb. 8, 2016, arxiv.org/abs/1602.02650, 8 pages.

Notice of Allowance in Australian Appln. 2020324398, mailed on Jan. 19, 2024, 3 pages.

Notice of Allowance in Japanese Appln. No. 2022-507491, mailed on Jan. 15, 2024, 5 pages (with English translation).

Notice of Allowance in Korean Appln. No. 10-2022-7006391, mailed on Feb. 3, 2024, 5 pages (with English translation).

Zorin, "Traveling-wave parametric amplifier with three-wave mixing in superconducting transmission line with embedded rf-SQUIDs" CoRR, submitted on Feb. 2016, arXiv:1602.02650v2, 6 pages.

Office Action in Australian Appln. No. 2020324398, dated Feb. 1, 2023, 3 pages.

Office Action in Australian Appln. No. 2020324398, mailed on Nov. 24, 2023, 3 pages.

Office Action in Canadian Appln. No. 3,150,036, dated Feb. 24, 2023, 3 pages.

Office Action in Japanese Appln. No. 2022-507491, dated Jun. 26, 2023, 9 pages (with English translation).

* cited by examiner

PARAMETRIC TRAVELING WAVE AMPLIFIER FOR QUBITS

CROSS-REFERENCE TO RELATED APPLICATIONS

This application is a National Stage Application under 35 U.S.C. § 371 and claims the benefit of International Patent Application No. PCT/US2020/044743, filed on Aug. 3, 2020, which claims priority to U.S. Provisional Patent Application Ser. No. 62/882,929, filed on Aug. 5, 2019. The disclosure of the prior applications is considered part of and is incorporated by reference in the disclosure of this application.

TECHNICAL FIELD

The present disclosure relates to parametric amplifiers for qubits.

BACKGROUND

Quantum computing is a new computing technique that takes advantage of quantum mechanical phenomena, such as superposition of two quantum states and entanglement between the quantum states belonging to separate entities. In contrast to a digital computer, which stores and manipulates the information using "bits" configured to be in two bi-stable states (e.g. a "0" and "1"), quantum computing systems aim to manipulate information using "qubits" configured to be the superposition of the quantum states (e.g., a|0>+b|1>). Quantum states of each qubit can be entangled with one another, such that the measurement result of one qubit is strongly correlated with the measurement result of another qubit. In certain implementations, these properties may provide advantages over classical computing techniques.

SUMMARY OF THE INVENTION

Traveling wave parametric amplifiers (TWPA) include amplifiers based on transmission lines made of lumped element inductors and capacitors. In certain types of TWPAs, referred to Josephson junction TWPAs (also referred to as "Josephson TWPAs"), the inductors are formed from transmission lines containing Josephson junctions, which provide a non-linear inductance. Modulating this inductance with a large pump tone can be used to transfer energy to other signals propagating through the device, leading to parametric amplification. TWPAs may be useful tools in superconductor-based quantum computing systems as the parametric amplification can provide high fidelity state measurements of superconducting qubits with near quantum-limited noise.

In some implementations, TWPAs are designed to have an impedance that matches the impedance of loads to which the TWPAs are connected in order to reduce electromagnetic reflections. Such impedance matching may require modifying the capacitance of the TWPA. In general, in some aspects, the subject matter of the present disclosure covers techniques and devices in which capacitance can be incorporated within a TWPA without the need to introduce lossy dielectric material that may otherwise absorb signals and add noise to the TWPA operation.

In particular, the subject matter of the present disclosure encompasses TWPAs that include: a co-planar waveguide having at least one Josephson junction interrupting a center trace of the co-planar waveguide; and at least one shunt capacitor formed by a grounded superconductor trace that crosses over and is separated from a center trace of the co-planar waveguide by a gap. The superconductor trace and co-planar waveguide thus form the plates of the shunt capacitor, which are separated by the gap height. As the space between the plates is formed by a gap (e.g., made of air or vacuum), rather than a lossy dielectric solid, signal absorption and noise within the TWPA can be reduced, especially when the TWPA is operated under vacuum conditions.

A parametric traveling wave amplifier device including: a co-planar waveguide, where the co-planar waveguide includes at least one Josephson junction interrupting a center trace of the co-planar waveguide; and at least one shunt capacitor coupled to the co-planar waveguide, where each shunt capacitor of the at least one shunt capacitor includes a corresponding superconductor trace extending over an upper surface of the center trace of the co-planar waveguide, where a gap separates the superconductor trace from the upper surface of the center trace, and where the co-planar waveguide including the at least one Josephson junction and the at least one shunt capacitor establishes a predefined overall impedance for the traveling wave parametric amplifier.

Implementations of the device may include one or more of the following features. An impedance of the traveling wave parametric amplifier is a function of a height of the gap of each shunt capacitor. The device where the superconductor trace extends over the center trace without also extending over the at least one Josephson junction. The device where the superconductor trace is elongated in a direction that is orthogonal to an elongated direction of the center trace. The device where the superconductor trace provides an air-bridge over the center trace. The device where the co-planar waveguide includes a first ground plane extending along a first side of the center trace and includes a second ground plane extending along a second side of the center trace, where a first end of the air-bridge is electrically connected to the first ground plane and a second end of the air-bridge is electrically connected to the second ground plane. The device including: a first substrate; and a second substrate bonded to the first substrate, where the co-planar waveguide is arranged on an upper surface of the first substrate, and the superconductor trace is arranged on the second substrate. The device where the first substrate is bump bonded to the second substrate. The device where the co-planar waveguide includes: a first ground plane extending along a first side of the center trace; and a second ground plane extending along a second side of the center trace, where the superconductor trace is electrically connected at a first end through a first bump bond to the first ground plane and is electrically connected at a second send through a second bump bond to the second ground plane. The device including a second component, where the predefined overall impedance of the traveling wave parametric amplifier matches an impedance of the second component. The device where the predefined overall impedance is about 50 ohms.

One general aspect includes a method of fabricating a parametric traveling wave amplifier, the method including: providing a first substrate; forming, on the first substrate, a co-planar waveguide including at least one Josephson junction interrupting a center trace of the co-planar waveguide; fixing at least one superconductor trace above the co-planar waveguide to form at least one shunt capacitor, respectively, where each superconductor trace of the at least one shunt capacitor extends over an upper surface of the center trace of the co-planar waveguide and is separated from the upper surface by a corresponding gap, and where the co-planar waveguide including the at least one Josephson junction and the at least one shunt capacitor establish a predefined overall impedance for the traveling wave parametric amplifier.

Implementations may include one or more of the following features. The method where, for each superconductor trace, fixing the at least one superconductor trace above the co-planar waveguide includes: providing a layer of dielectric material over the co-planar waveguide; patterning the layer of dielectric material to form a pad of dielectric material and to reveal a portion of the co-planar waveguide; forming a superconductor layer on the pad of dielectric material and on the portion of the co-planar waveguide; patterning the superconductor layer to form the superconductor trace; and removing the pad of dielectric material to form the gap, where the superconductor trace provides an air-bridge over the center trace. The method where the co-planar waveguide includes a first ground plane extending along a first side of the center trace and a second ground plane extending along a second side of the center trace, and where patterning the superconductor layer to form the superconductor trace includes forming a first electrical contact between a first end of the superconductor trace and the first ground plane and forming a second electrical contact between a second end of the superconductor trace and the second ground plane. The method where, for each superconductor trace of the at least one superconductor trace, fixing the superconductor trace above the co-planar waveguide includes: providing a second substrate including the superconductor trace; bonding the second substrate to the first substrate so that the superconductor trace is positioned over the upper surface of the center trace and is separated from the upper surface by the corresponding gap.

The method where the co-planar waveguide includes a first ground plane extending along a first side of the center trace and a second ground plane extending along a second side of the center trace, and where bonding includes: forming a first bump bond between a first end of the superconductor trace and the first ground plane; and forming a second bump bond between a second end of the superconductor trace and the second ground plane. The method where each superconductor trace of the at least one superconductor trace is elongated in a direction that is orthogonal to an elongated direction of the center trace. The method where each superconductor trace of the at least one superconductor trace extends over the center trace without also extending over the at least one Josephson junction. The method forming a second component, where the predefined overall impedance matches an impedance of a second component. The method where the predefined impedance is about 50 ohms.

Various implementations of the subject matter disclosed herein may have one or more advantages. For example, in some implementations, For the purposes of this disclosure, a superconductor (alternatively, superconducting) material may be understood as a material that exhibits superconducting properties at or below a superconducting critical temperature. Examples of superconductor material include, but are not limited to, aluminum (superconducting critical temperature of, e.g., 1.2 kelvin), niobium (superconducting critical temperature of, e.g., 9.3 kelvin) and titanium nitride (superconducting critical temperature of, e.g., 5.6 kelvin).

The details of one or more implementations are set forth in the accompanying drawings and the description below.

Other features and advantages will be apparent from the description, drawings, and claims.

BRIEF DESCRIPTION OF THE DRAWINGS

Like reference numbers and designations in the various drawings indicate like elements.

DETAILED DESCRIPTION OF THE INVENTION

Readout of a qubit may be accomplished using the dispersive interaction between a qubit and a readout device (e.g., a measurement resonator). For example, a probe tone may be generated for sampling the frequency of the readout device to measure a phase shift that depends on the state/frequency of the qubit. However, in some cases, the signal obtained from the readout device may be attenuated over the output line, decreasing the signal to noise ratio and making measurement more difficult. To improve the signal to noise ratio, an amplifier may be placed at the output of the readout device. An example of an amplifier that may be used to enhance the output signal is the traveling wave parametric amplifier (TWPA). A TWPA provides relatively high bandwidth, dynamic range and saturation power, thus potentially permitting frequency multiplexing and therefore improvements in the scaling of quantum processors.

Figure 1:
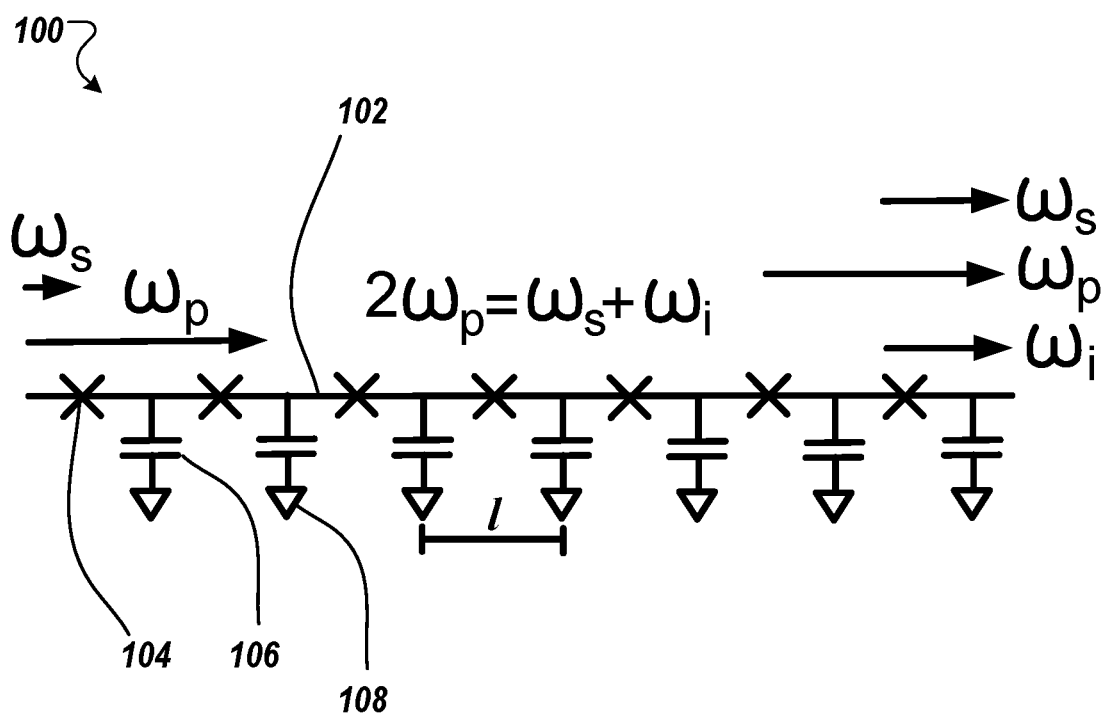
FIG. 1 is a diagram that illustrates a circuit schematic of an exemplary traveling wave parametric amplifier.

FIG. 1 is a diagram that illustrates a circuit schematic of an exemplary TWPA 100. The TWPA 100 is an amplifier based on a transmission line 102 that includes lumped element inductors and capacitors. In certain implementations, the transmission line 102 may include, e.g., a co-planar waveguide, such as a superconducting co-planar waveguide. Co-planar waveguides, including superconducting co-planar waveguides, may include a center electrically conducting trace formed on a substrate and bordered on two sides by ground planes, in which the ground planes are spaced apart from the center trace. In the case of superconducting co-planar waveguides, the ground planes and center trace may be formed of a superconductor material such as, e.g., aluminum.

The inductors of the TWPA 100 include Josephson junctions 104, which provide a non-linear inductance. Modulating this inductance with a large pump tone, $\omega_p$, will transfer energy to other signals (e.g., a signal $\omega_s$ obtained from a qubit measurement resonator) propagating through the device leading to parametric amplification. In particular, the pump tone $\omega_p$ modulates the current dependent inductance of the TWPA 100 so as to couple the pump tone $\omega_p$ to the signal $\omega_s$ from the measurement resonator and an idler tone $\omega_i$ via frequency mixing such that $\omega_s+\omega_i=2\omega_p$. The relationship between pump, signal, and idler frequencies is adjusted to satisfy conservation of energy. Gain, bandwidth, and dynamic range of the TWPA may be determined by the coupled mode equations of a nonlinear transmission line. Further details on the operation and fabrication of a TWPA can be found in "Traveling wave parametric amplifier with Josephson junctions using minimal resonator phase matching," T. C. White, et al., Applied Physics Letters, Vol. 106, 242601-1 to 242601-5 (2015), which is incorporated herein by reference in its entirety.

For improvements in performance, the Junction inductance should be fairly large. For example, the Junction inductance may be about 10 times or more the geometric inductance of the coplanar waveguide. To avoid unwanted reflections, however, the impedance of the TWPA 100 also should be matched to the impedance of the load. In many implementations, this impedance is set to 50 Ohms. Since the impedance, Z, of the TWPA 100 varies as the square root of the inductance per unit length (L/l) divided by capacitance per unit length (C/l), additional capacitors 106 to ground 108, also referred to as "shunt capacitors", may be added to the TWPA 100 to tune the impedance close to the desired impedance. In some implementations, the extra capacitance is large enough that the capacitors 106 are implemented using a parallel plate capacitor design, in which the dielectric of the parallel plate capacitor is provided by a deposited insulator such as, e.g., $SiO_2$. In some implementations, the geometric inductance added by the additional capacitors may be ignored.

The deposited insulators typically are lossy at microwave frequencies, and can absorb signals within the amplifier 100 as well as increase noise in the amplifier. When such amplifiers are used as the first stage of amplification, however, this loss may be detrimental as loss in signal will, in some implementations, be equivalent to an increase in noise.

The TWPAs of the present disclosure may be formed to include parallel plate capacitors without the use of a deposited insulator. For instance, the parallel plate capacitors of the present disclosure may be formed using air or vacuum as the dielectric. By eliminating the deposited insulators, it is possible, in some implementations, to reduce signal absorption and noise within the TWPA.

The TWPAs of the present disclosure can be formed in various implementations. For instance, in some implementations, the superconductor trace for forming the parallel plate capacitor may be an air-bridge that connects at one end to ground (e.g., one ground plane of the co-planar waveguide), crosses over a center trace of the co-planar waveguide, and connects at a second end to ground (e.g., a second ground plane of the co-planar waveguide). In other implementations, the center trace of the co-planar waveguide, itself, is an air-bridge that extends over a superconductor trace that connects at one end to ground (e.g., one ground plane of the co-planar waveguide) and connects at a second end to ground (e.g., a second ground plane of the co-planar waveguide). In still other implementations, the co-planar waveguide is formed on a first substrate and the superconductor trace is formed on a second substrate that is bonded to (e.g., through bump bonding) and spaced apart from the first substrate. In any of the foregoing implementations, the spacing between the center trace of the co-planar waveguide and the superconductor trace may be used to adjust an impedance of the shunt capacitor. In any of the foregoing implementations, the directions along which the center trace and the superconductor trace are elongated may be orthogonal to one another. Moreover, the superconductor trace may overlap the center trace without also extending over any of the Josephson junctions.

Figure 2A:
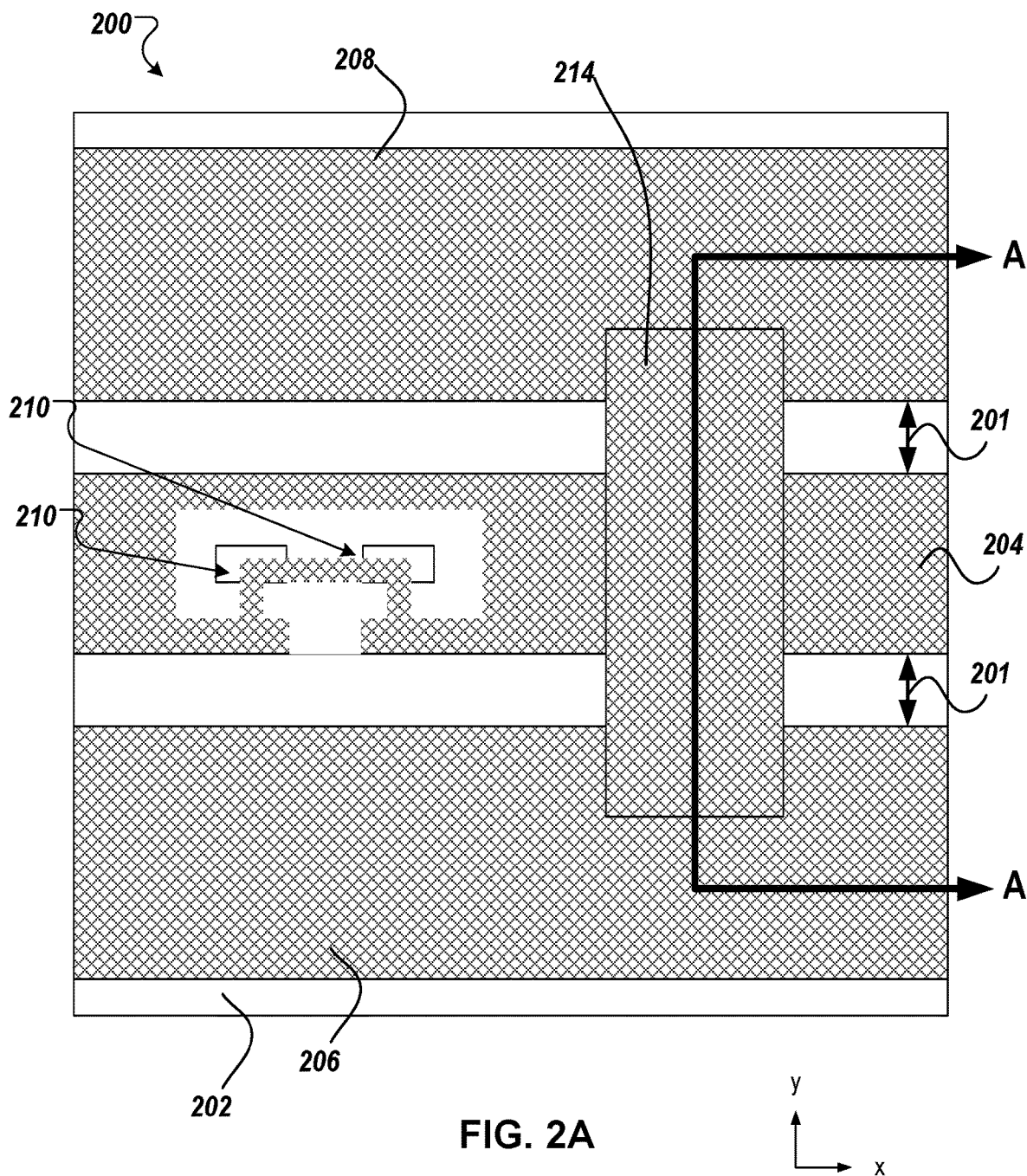
FIG. 2A is a schematic that illustrates a top view of an exemplary traveling wave parametric amplifier.
Figure 2B:
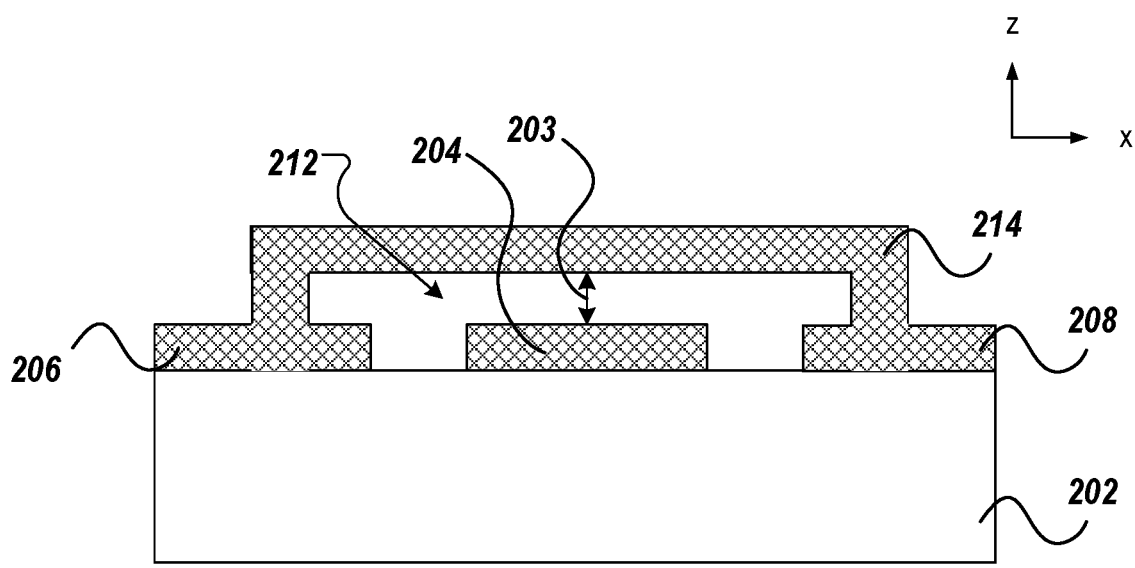
FIG. 2B is a schematic that illustrates a cross-section view of the traveling wave parametric amplifier of FIG. 2A through line A-A.

FIG. 2A is a schematic that illustrates a top view along an x-y plane of an exemplary traveling wave parametric amplifier 200 according to the present disclosure. FIG. 2B is a schematic that illustrates a cross-section view along an x-z plane of the traveling wave parametric amplifier 200 of FIG. 2A through line A-A. The TWPA 200 shown in FIG. 2A is a Josephson TWPA and includes a substrate 202 and a co-planar waveguide formed on the substrate 202. In the present example, the substrate 202 is a dielectric material such as, e.g., silicon or sapphire, though other dielectrics may be used instead.

The co-planar waveguide formed on the substrate includes a center trace 204. The co-planar waveguide also includes a first ground plane 206 and a second ground plane 208 extending along a first side and a second side, respectively, of the center trace 204. The ground planes 206, 208 and the center trace are formed from electrically conductive material. In a particular example, the electrically conductive material is a superconductor thin film such as aluminum, niobium, or titanium nitride. The ground planes 206, 208 are spaced apart from the center trace 204 by a distance 201, which may be constant along the length of the trace 204.

The TWPA 200 also includes at least one Josephson junction 210 interrupting the center trace 204 of the co-planar waveguide. The example in FIG. 2A shows two Josephson junctions 210 connected in series. The at least one Josephson junction 210 provides the non-linear inductance portion of the TWPA 200. A Josephson junction is a quantum mechanical device made of two superconducting electrodes separated by a barrier such as, for example, a thin insulating film. For instance, in the present example, the at least one Josephson junction 210 may be formed from a tri-layer of $Al/Al_2O_3/Al$ thin films.

To provide the additional capacitance that, along with the inductance of the co-planar waveguide and the inductance of the Josephson junction, provides a predefined overall impedance for the TWPA 200, the TWPA 200 also includes at least one shunt capacitor. In the present example, the at least one shunt capacitor is a parallel plate capacitor, in which a first plate of the capacitor is provided by the center trace 204 of the co-planar waveguide and a second plate of the capacitor is provided by an electrically conducting trace that forms an air-bridge structure. In particular, the electrically conducting trace—may be the—superconductor trace 214. In the present example, the superconductor trace 214 crosses over an upper surface of the center trace 204 of the co-planar waveguide. For the purposes of this example, the upper surface is understood to be the surface of the trace 204 that is opposite from the surface of the trace 204 that faces the substrate 202. The superconductor trace 214 may be elongated in a direction that is orthogonal to an elongated direction of the center trace 204.

As shown in FIG. 2B, a first end of the superconductor trace 214 is in physical contact with, and thus electrically connected to, the first ground plane 206. A second end of the superconductor trace 214 is in physical contact, and thus electrically connected to, the second ground plane 208. Each of the first ground plane 206, second ground plane 208, and center trace 204 are supported by the substrate 202. Accordingly, the superconductor trace 214 is grounded and forms a ground plate of the shunt capacitor. As also shown in FIG.

2B, the superconductor trace 214 crosses over the upper surface of the center trace 204. The gap 212 between the upper surface of the center trace 204 and the lower surface of the air-bridge formed by superconductor trace 214 does not include a dielectric film. That is, a gap 212 is provided between the superconductor trace 214 and the center trace 204. This gap may include air. Alternatively, a device that includes the TWPA 200 may be used in a vacuum environment and therefore the gap 212 may be a vacuum. The height 203 of the gap (understood here to be the distance measured directly across opposing faces of the center trace 204 and the superconductor trace 214) may be between, e.g. about 30 nm to about 10 microns. The capacitance of the shunt capacitor varies proportional to 1/d, where d corresponds to the gap height 203. Accordingly, by adjusting the height 203 of the gap 212, the shunt capacitance value can be varied. Similarly, adjusting the area of overlap between the center trace 204 and the superconductor trace 214 also can be used to vary the shunt capacitance value. In particular, the height and/or overlapping area of the superconducting trace 214 may be predefined to achieve a corresponding capacitance that, together with the inductance of the center trace 204 and of the at least one Josephson junction, establishes a predefined overall impedance for the traveling wave parametric amplifier 200. As an example, the area of overlap may be about 100 um by about 14 um for a separation gap between the superconducting trace 214 and the center trace 204 of about 300 nm. The predefined overall impedance of the traveling wave parametric amplifier may be set to closely match an impedance of a second component on the chip. For instance, the predefined overall impedance of the TWPA 200 may be set to an impedance of about 50 ohms (which may correspond to the impedance of standard microwave couplers), e.g., within 1 ohm, within 2 ohms, within 3 ohms, within 4 ohms, or within 5 ohms of an impedance of 50 ohms. This is due to a majority of the impedance of the TWPA being derived from the inductance of the at least one Josephson junction in the center trace 204. When the TWPA device is pumped, the average inductance will increase, but the increase is relatively small (e.g., about 10%) compared to the difference in impedance of the co-planar waveguide with and without at least one Josephson junction. Accordingly, an engineered TWPA including the at least one shunt capacitor may have, e.g., an impedance of around 47-48 ohms when no pump signal is applied, which then increases to 50 ohms when the pump is at optimal power. As an example, the overall inductance may be expressed as $\sqrt{\{(L_{junction}+L_{stray})/(C_{shunt}+C_{stray})\}}$, where $L_{junction}$ is the inductance of the Josephson junction, $L_{stray}$ is stray inductance, $C_{shunt}$ is the shunt capacitance, and $C_{stray}$ is stray capacitance. This assumes all values are per unit length.

Figure 3A:
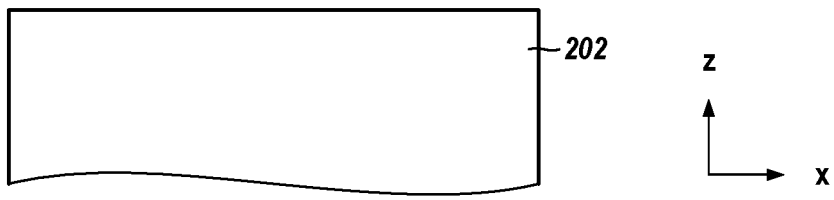
FIGS. 3A-3I are schematics that depict a fabrication process for an airbridge of FIGS. 2A-2B.

The superconductor TWPA 200 may be fabricated using the same or similar processing techniques as employed for integrated circuit fabrication (e.g. photolithography, material deposition such as sputtering or chemical vapor deposition, and material removal such as etching or lift-off). FIGS. 3A-3I are schematics that depict an exemplary fabrication process for the superconductor trace 214 portion of the TWPA 200 of FIGS. 2A-2B. In particular, FIGS. 3A-3I are schematics that depict processing steps as cross section views along an x-z plane at the section A-A of FIG. 2A. In a first step, as shown in FIG. 3A, a substrate 202 is provided. The substrate 202 is a dielectric material including, e.g., silicon or sapphire. Preferably, a single crystal silicon or sapphire may be used for the substrate to reduce the density of the two level states (TLS) within the substrate 202.

Figure 3B:
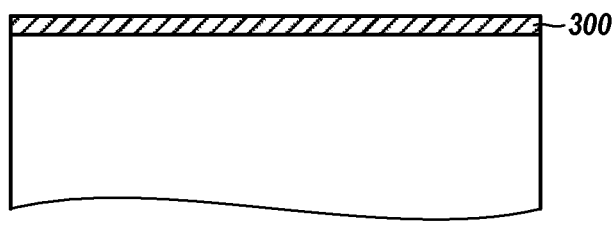
Figure 3C:
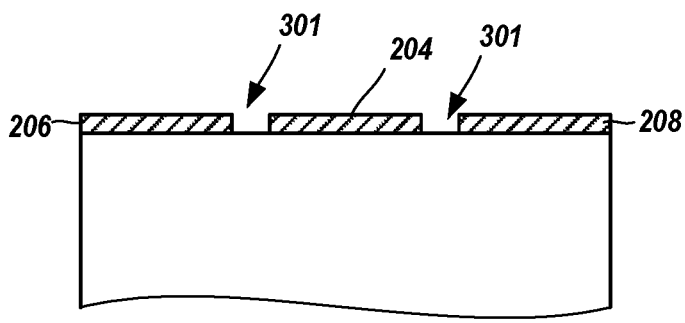

Subsequently, as depicted in FIG. 3B, a first electrically-conductive layer 300, such as a layer of superconductor material, for example, may be deposited uniformly over the substrate 202. The layer 300 may include, e.g., aluminum, niobium or titanium nitride, among other superconductor materials. Referring to FIG. 3C, the electrically-conductive layer 300 then is patterned as shown in FIG. 3C. In this example, two openings 301 are formed in layer 300 and extend into and out of the page (e.g., along the y-axis), such that the base substrate 202 is exposed through the openings 301. The openings 301 establish the first ground plane 206, the center trace 204 and the second ground plane 208. In other words, the openings 301 correspond to the two trenches, separating the ground plane 206 from the center trace 204 and the ground plane 208 from the center trace 204. Patterning of the first electrically-conductive layer 300 can be achieved by depositing a photoresist layer, UV exposure, developing the photoresist layer and wet or dry etching of the exposed regions of layer 300. Alternatively, in some implementations, a lift-off process is used to form the openings 301.

Figure 3D:
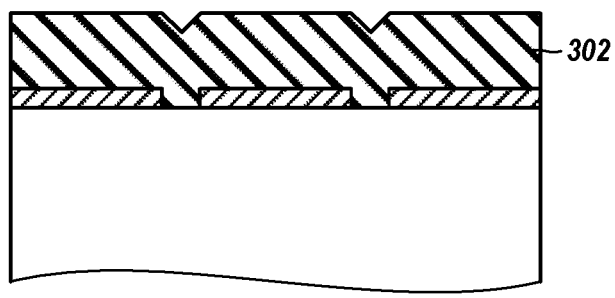
Figure 3E:
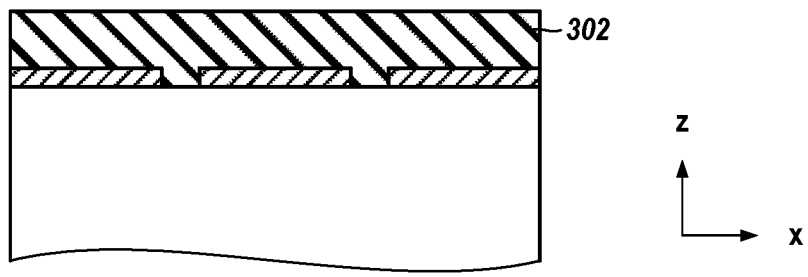

Following patterning of the first electrically conductive layer 300, referring to FIG. 3D, a layer of dielectric material 302, for example a silicon dioxide layer, may be deposited over the substrate 202 to cover the layer 300 and the openings 301, as shown in FIG. 3D. Layer 302 corresponds to an interlayer dielectric intended for supporting a to-be-formed electrically-conductive bridge structure. Referring to FIG. 3E, the device layer of dielectric material 302 may be planarized via chemical mechanical polishing (CMP). This step reduces the roughness introduced by the dimples around the two holes, which may affect the thickness and the uniformity of the subsequent layers.

Figure 3F:
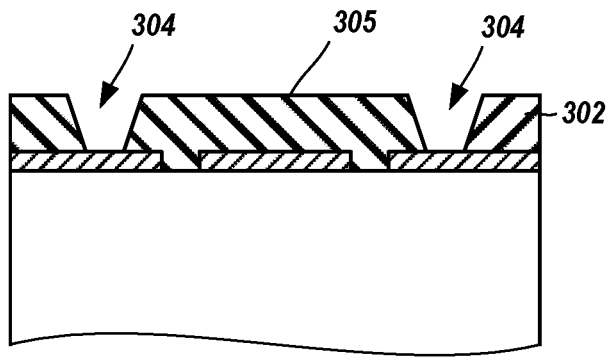

Subsequently, referring to FIG. 3F, the layer of dielectric material 302 may be patterned to form the supporting structure 305 or pad region that supports a to-be-formed electrically-conductive bridge, as shown in FIG. 3F. In particular, the layer of dielectric material 302 may be patterned such that openings 304 are formed within layer 302 to expose portions of the first ground plane 206 and to expose portions of the second ground plane 208. The openings may be formed using, e.g., a dry or wet-based etch process.

Figure 3G:
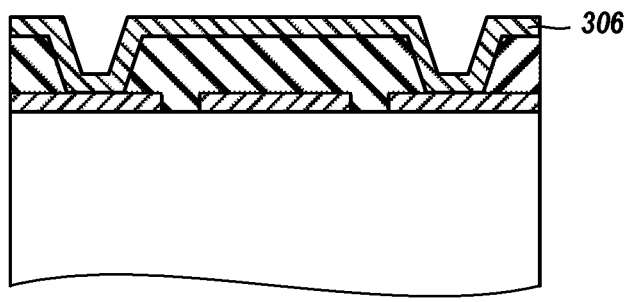
Figure 3H:
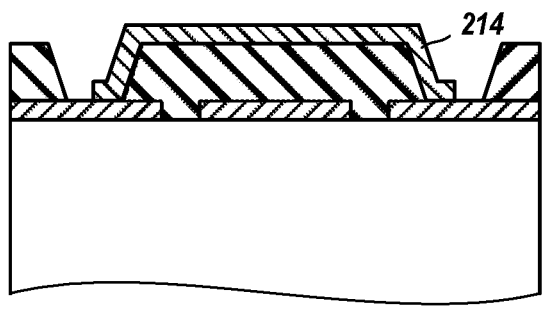
Figure 3I:
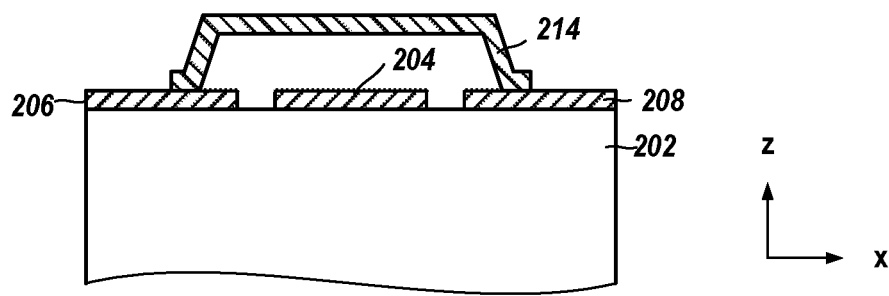

Referring to FIG. 3G, a second electrically-conductive layer 306 may be deposited over the dielectric layer 302 (FIG. 3F) and the openings 304 (FIG. 3G) such that the deposited layer 306 comes into contact and is formed on the exposed portions of ground planes 206, 208 (FIG. 3C). The electrically conductive material of layer 306 may include superconductor material, such as aluminum, niobium or titanium nitride, among others. Subsequently, as shown in FIG. 3H, the second electrically-conductive layer 306 may be patterned such that only the portion of the second electrically-conductive layer corresponding to the bridge superconductor trace 214 remains and the rest is removed. Patterning may include, e.g., wet or dry-based etching processes. Referring to FIG. 3I, after patterning the layer 306 to form bridge superconductor trace 214, as shown in FIG. 3I, the remaining dielectric material 304 underneath the bridge superconductor trace 214 and around the bridge superconductor trace 214 is removed. For instance, removing the dielectric material 302 may include performing a dry-vapor etch. In particular, if the dielectric material 302 is silicon dioxide, the silicon dioxide may be selectively removed using dry vapor HF (VHF) etching. Alternatively, in some implementations, the dielectric layer 302 may be selectively removed using a plasma-based etching process, such as plasmas generated with tetrafluoromethane vapour, nitrogen trifluoride vapour, or xenon difluoride, depending on the particular material used as dielectric layer 302. Removing the dielectric layer 302 thus leaves an "air-bridge" structure that crosses over the center trace 204 and is supported at one end by the first ground plane 206 and at another end by the second ground plane 208, where first ground plane 206, the second ground plane 208, and center trace 204 are supported by the substrate 202.

Figure 4A:
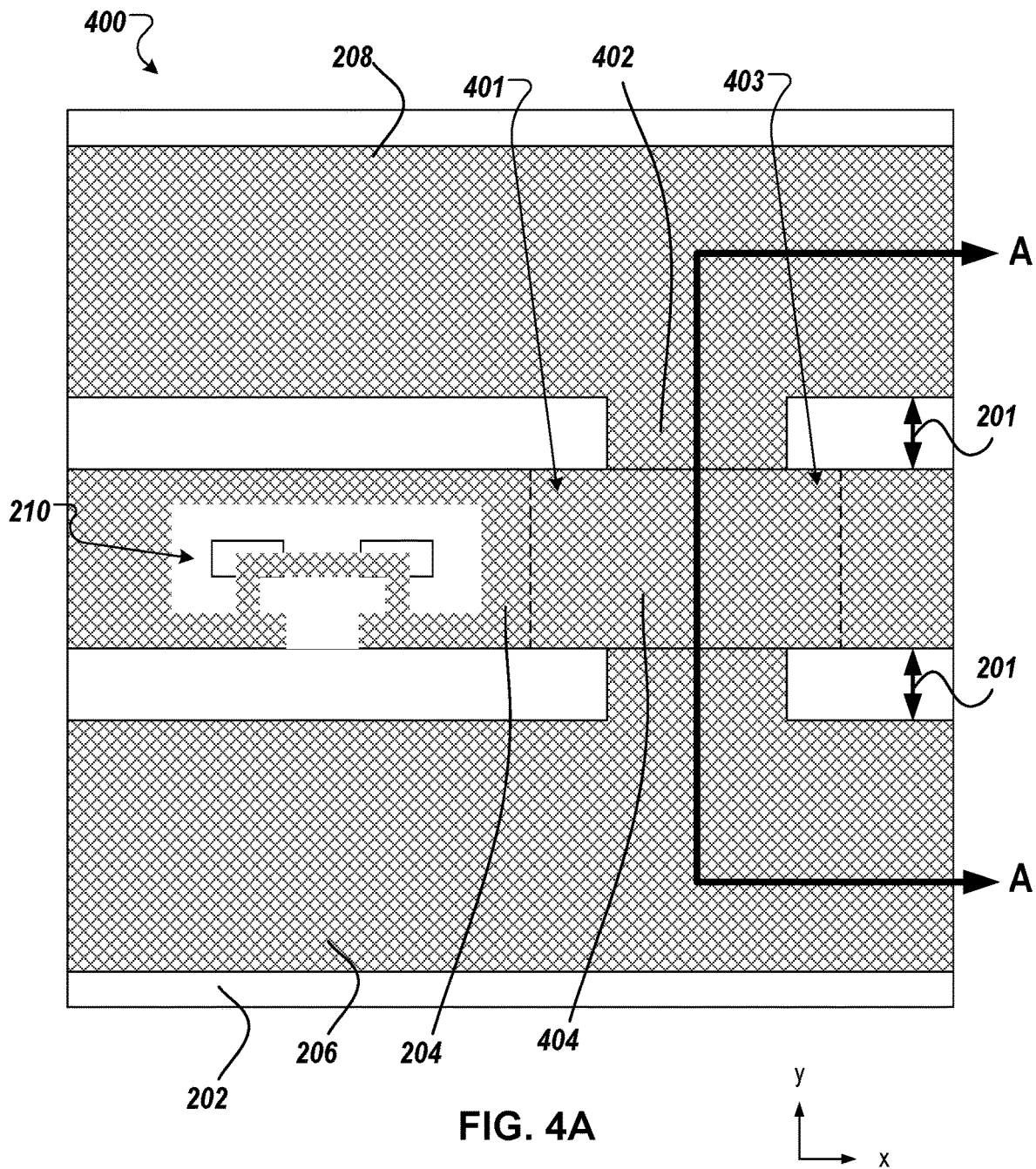
FIG. 4A is a schematic that illustrates a top view of an exemplary traveling wave parametric amplifier.
Figure 4B:
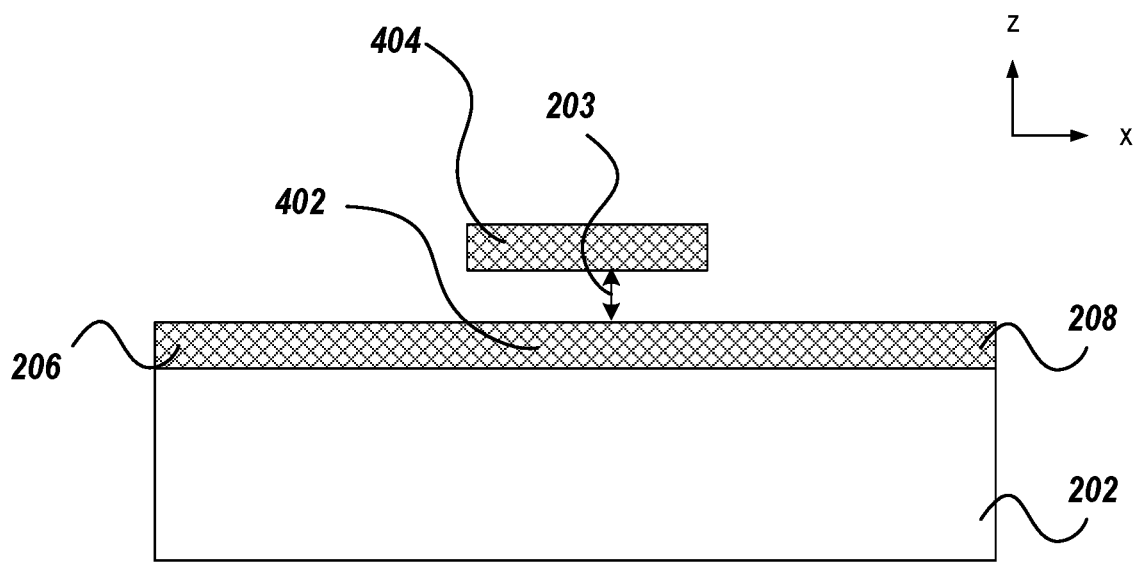
FIG. 4B is a schematic that illustrates a cross-section view of the traveling wave parametric amplifier of FIG. 4A through line A-A.

Although the TWPA 200 of FIGS. 2A-2B depicts the air-bridge structure, e.g., superconductor trace 214, as being used to couple the two ground planes, in some implementations, the air-bridge structure may be formed as part of the center trace 204 instead. For instance, FIG. 4A is a schematic that illustrates a top view along an x-y plane of an exemplary traveling wave parametric amplifier 400 in which the center trace 204 crosses over a coupling portion 402 between the first ground plane 206 and the second ground plane 208. FIG. 4B is a schematic that illustrates a cross-section view along an x-z plane of the traveling wave parametric amplifier of FIG. 4A through line A-A.

In particular, as shown in FIGS. 4A and 4B, in the exemplary TWPA 400, the coupling portion 402 may be formed as part of the same layer of electrically conductive material that forms the first ground plane 206 and the second ground plane 208 supported by substrate 202 and therefore can be patterned in the same processing step as the first ground plane 206 and the second ground plane 208. In contrast, a portion 404 of the center trace 204 is constructed as an air-bridge that crosses over the center trace 204. As shown in FIG. 4B, the air-bridge portion 404 of the center trace 204 is positioned above the coupling portion 402 by a corresponding gap height 203. Referring to FIG. 4A, the remaining portions of the center trace 204 may be formed in the same layer as the first ground plane 206, second ground plane 208, and the coupling portion 402 on substrate 202. The ground planes 206, 208 are spaced apart from the center trace 204 by a distance 201, which may be constant along the length of the trace 204.

The TWPA 400 also includes at least one Josephson junction 210 interrupting the center trace 204 of the co-planar waveguide. The example in FIG. 4A shows two Josephson junctions 210 connected in series. The air-bridge portion 404 may be anchored at a first end 401 to the portion of center trace 204 formed in the same layer as the ground planes 206, 208, and may be anchored at a second end 403 to another portion of center trace 204 formed in the same layer as ground planes 206, 208. As with the TWPA 200, both the gap height 203 and the overlapping area between the air-bridge and the coupling portion 402 may be adjusted to vary the capacitance, which in turn can be used to vary the overall impedance of the TWPA 400 to a predefined value.

The portion 404 serving as the air-bridge may be fabricated in a similar manner as the air-bridge of FIG. 2A. For instance, fabricating portion 404 may include: forming and patterning a first electrically conductive layer that includes the underlying coupling portion 402, the first ground plane 206, and the second ground plane 208 and certain portions of the center trace 204; depositing and patterning an insulating layer above the first electrically conductive layer; depositing and patterning a second electrically conductive layer on the patterned insulating layer to define the air-bridge structure; and removing the insulating layer to form the air-bridge structure.

Figure 5A:
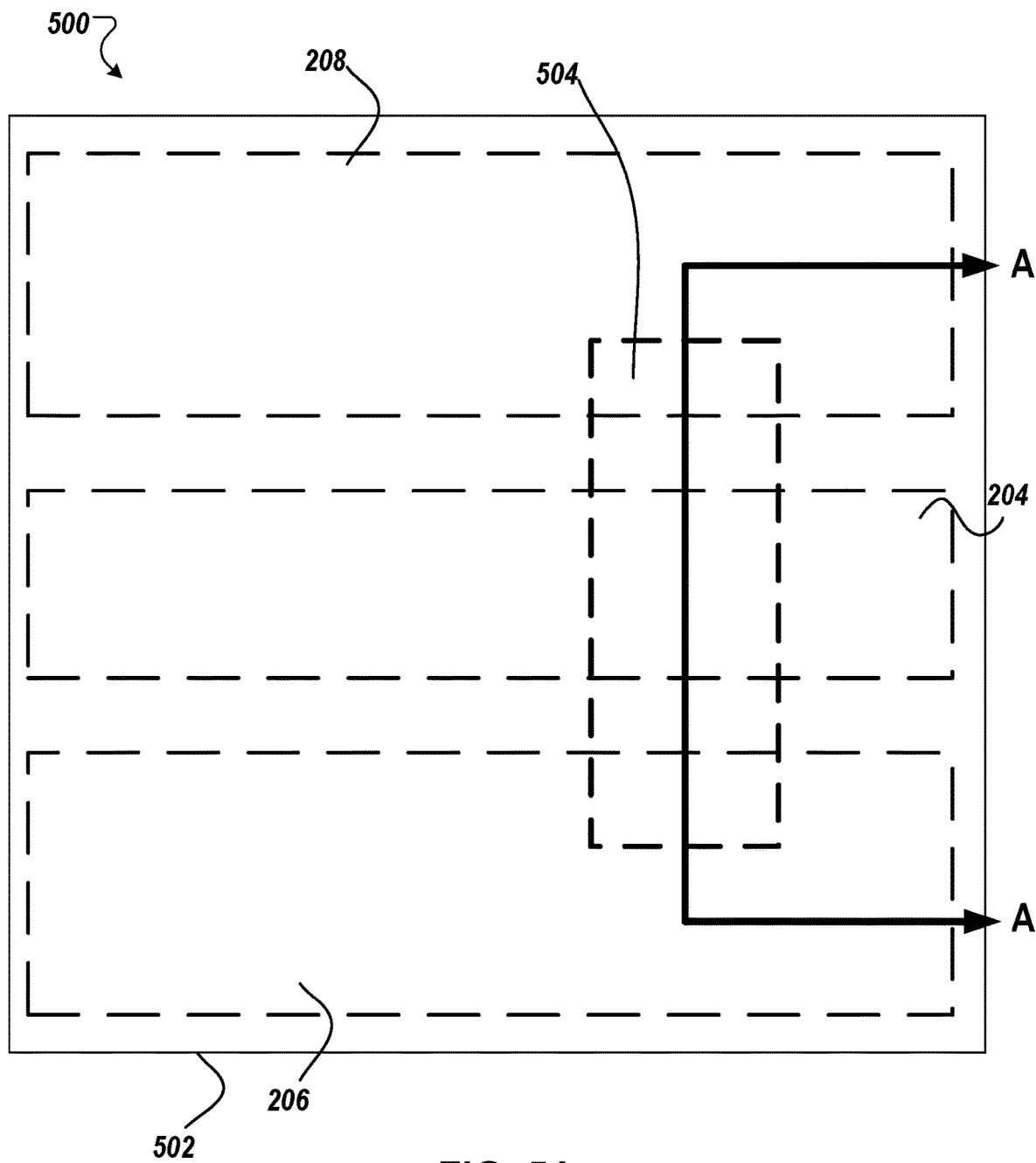
FIG. 5A is a schematic that illustrates a top view of an exemplary traveling wave parametric amplifier.
Figure 5B:
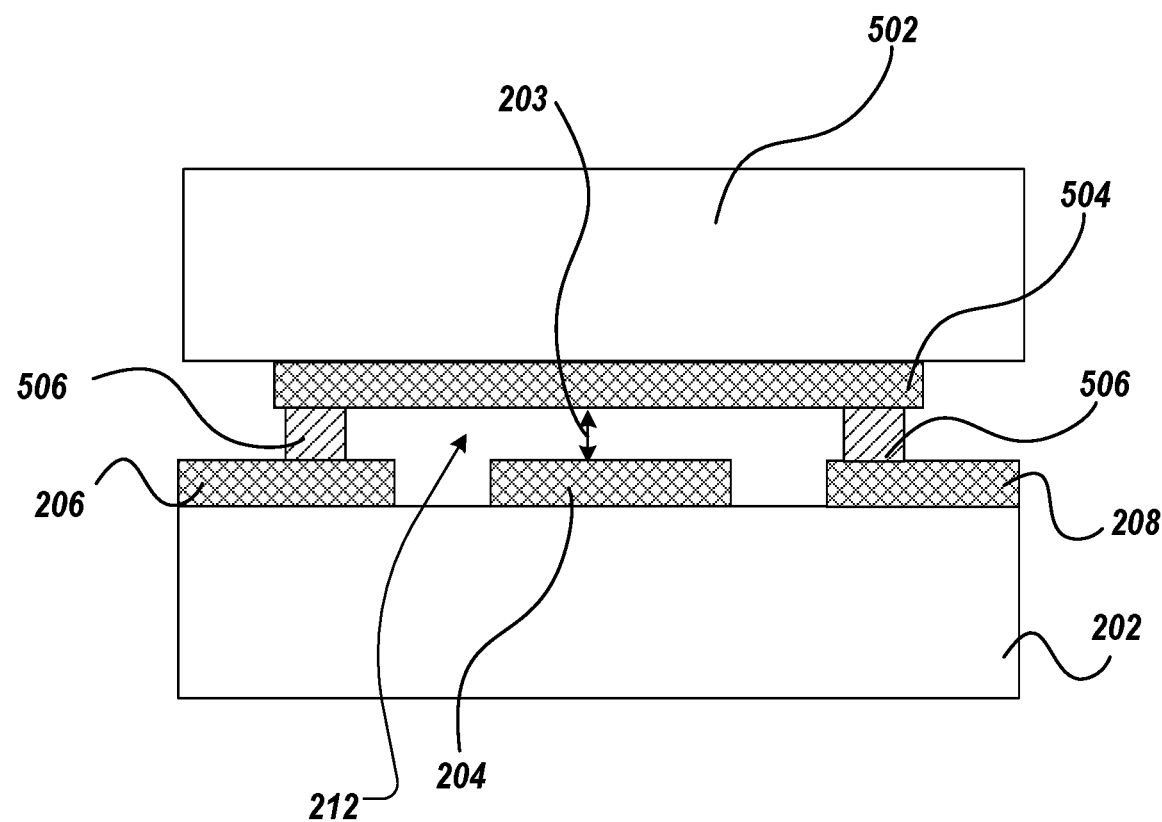
FIG. 5B is a schematic that illustrates a cross-section view of the traveling wave parametric amplifier of FIG. 5A through line A-A.

Rather than an air-bridge structure, the shunt capacitor may be formed, in some implementations, using a stacked structure. FIG. 5A is a schematic that illustrates a top view of an exemplary traveling wave parametric amplifier 500 formed on a second substrate 502 using a stacked structure. FIG. 5B is a schematic that illustrates a cross-section view of the traveling wave parametric amplifier 500 of FIG. 5A through line A-A. In FIG. 5A, the first ground plane 206, the center trace 204, the second ground plane 208 and the superconducting trace 504 that crosses over the center trace 204 are depicted using dashed lines to indicate their relative placement in the TWPA 500.

As shown in FIG. 5B, the superconductor trace 504 is formed on a second substrate 502 and stacked to the first substrate 202 through bonding elements 506. The second substrate 502 may include, e.g., a dielectric substrate, such as silicon or sapphire. The superconductor trace 504 may be elongated in a direction that is orthogonal to an elongated direction of the center trace 204. The bonding elements 506 provide a direct physical and electrical connection between a first end of the superconductor trace 504 and the first ground plane 206 as well as a direct physical and electrical connection between a second end of the superconductor trace 504 and the second ground plane 208. Other than providing an electrical connection, the bonding elements 506 also set the gap height 203. By adjusting the height 203 of the gap 212, the shunt capacitance value can be varied. The bonding elements 506 may be formed, e.g., from a superconductor material such as aluminum, niobium or titanium nitride, among others. In some implementations, a diffusion barrier is provided between the bonding elements 506 and the ground planes and/or superconductor trace 504 to which the bonding elements 506 are connected. For example, in some cases, the barrier layer may be formed from titanium nitride, platinum, or tungsten.

An advantage of using bump bonding versus using air-bridge structures to establish the shunt capacitor is that bump bonding allows, in some implementations, setting the capacitance of TWPAs on a device-by-device basis, rather than on a wafer-by-wafer basis. For example, in some implementations, the bottom portion of the stack (i.e., the portion including the ground planes and center trace of the TWPA) may be fabricated after which the wafer including the bottom portion may be diced into separate chips. Flip-chip bonding then may be used to bond the upper portion of the stack (i.e., the portion including the superconductor trace 504 that is intended to cross over the center trace 204) to the bottom stack portion. The capacitance of the shunt capacitor, and thus the overall impedance of the TWPA, then may be adjusted in-situ during the bonding process by varying the gap height 203. Accordingly, the need to re-design the TWPA structure in case of a variation in impedance can be avoided. As explained herein, the height 203 and/or overlapping area of the superconducting trace 504 with the center trace 204 may be predefined to achieve a corresponding capacitance that, together with the inductance of the center trace 204 and of the at least one Josephson junction, establishes a predefined overall impedance for the traveling wave parametric amplifier 500. The predefined overall impedance of the traveling wave parametric amplifier may be set to closely match an impedance of a second component on the chip. For instance, the predefined overall impedance of the TWPA 500 may be set to an impedance of about 50 ohms (which may correspond to the impedance of standard microwave couplers), e.g., within 1 ohm, within 2 ohms, within 3 ohms, within 4 ohms, or within 5 ohms of an impedance of 50 ohms.

Figure 6A:
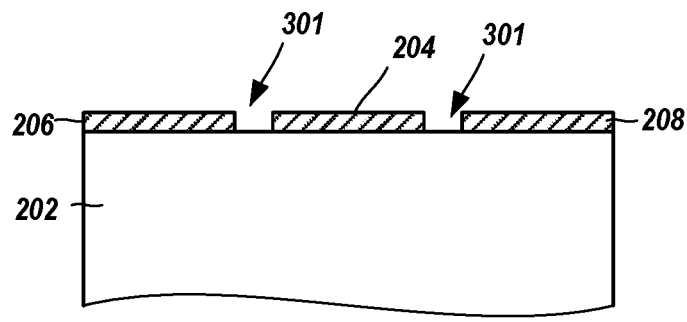
FIG. 6A-6D are schematics that depict a fabrication process for the TWPA of FIG. 5A.
Figure 6B:
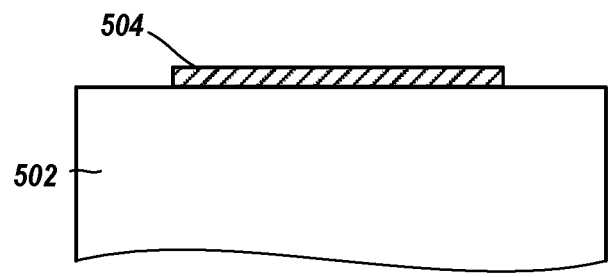
Figure 6C:
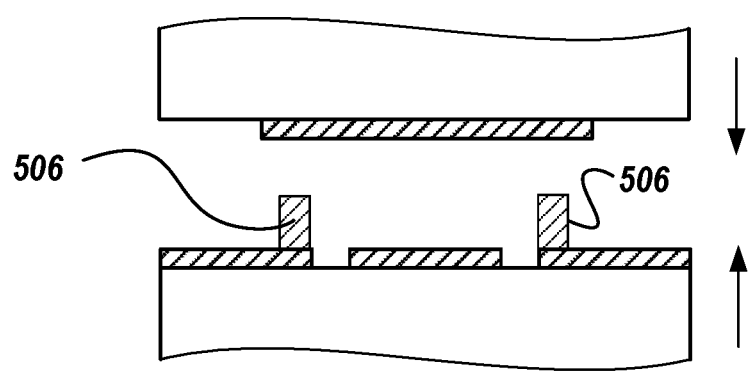

FIG. 6A-6D are schematics that depict a fabrication process for the TWPA of FIG. 5A. In a first step, as shown in FIG. 6A, a first substrate 202 including the first ground plane 206, the center trace 204 and the second ground plane 208 is provided. The ground planes may be separated from the center trace by corresponding openings 301. This substrate may be fabricated in the same manner as FIGS. 3A-3C described herein. Additionally, as shown in FIG. 6B, a second substrate 502 including a superconductor trace 504 is provided. The superconductor trace 504 may be fabricated by first depositing a layer of superconductor material on the substrate 502 and patterning (e.g., through photolithographahy and wet or dry etching processes or through lift-off processes) the deposited layer to form the trace 504. Subsequently, referring to FIG. 6C, bonding elements 506 may be formed. In some implementations, the bonding elements 506 may be formed on ground planes 206 and 208. Alternatively, the bonding elements 506 may be formed on the superconductor trace 504. The bonding elements 506 may be formed through a deposition process such as, e.g., thermal evaporation and may be patterned using a combination of photolithography and wet or dry etching processes or lift-off processes.

Figure 6D:
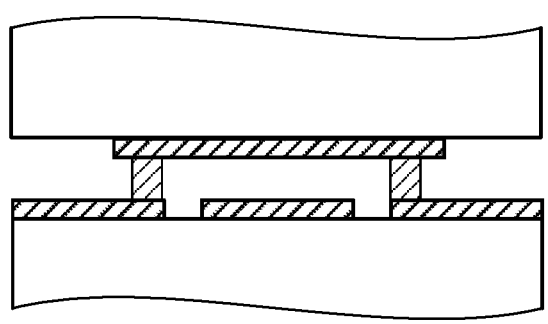

Referring to FIG. 6D, the substrates then are bonded together The two substrates may be joined to one another using, e.g., pressure bonding. Pressure bonding can be performed without heat applied (e.g., at room temperature). An example of the pressure used to form the bond is 25 Newtons for 1000 bumps in a 6 mm square chip. An advantage of performing the bonding at room temperature (e.g., in the range of between approximately 18° C. and approximately 30° C.) is that the formation of hillocks and voids at material interfaces can be reduced.

The thickness of the bonding elements 506 can be set so that the gap height 203 is spaced by a desired amount. For example, the height 203 FIG. 5B between a surface of the first chip facing an opposing surface of the second chip can be set to be between approximately 0.5 µm to approximately 100 µm (e.g., between approximately 0.5 µm to approximately 20 µm, between approximately 0.5 µm and approximately 15 µm, between approximately 0.5 µm and approximately 10 µm, between approximately 0.5 µm and approximately 5 µm, or between 30 approximately 0.5 µm and approximately 2.5 µm).

Implementations of the quantum subject matter and quantum operations described in this specification can be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, topological quantum computers, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In some implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements (also referred to as "quantum computing circuit elements" and "quantum information processing devices") include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDs) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

Fabrication of the quantum circuit elements and classical circuit elements described herein can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of 1.2 kelvin), niobium (superconducting critical temperature of 9.3 kelvin), and titanium nitride (superconducting critical temperature of 5.6 kelvin).

While this specification contains many specific implementation details, these details should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of embodiments have been described. Nevertheless, it will be understood that various modifications may be made without departing from the spirit and scope of the invention. For example, in some implementations, the TWPAs are kinetic inductance TWPAs, which may be formed at least in part, from materials exhibiting high kinetic inductance, LK in the microwave frequency range, e.g., between about 300 MHz and 300 GHz. Kinetic inductance TWPAs typically are operated at higher impedance (e.g., about 200 Ohms) because engineering the capacitance can be difficult using the geometries disclosed herein. Since kinetic inductance TWPAs exhibit a relatively weaker non-linearity, they tend to be much longer in order to achieve a desired gain. Accordingly, kinetic inductance TWPAs may benefit even more from having a low loss way to increase their capacitance per unit length, as described herein. As shown in the examples described herein, the superconductor trace that crosses over the center trace does so without also extending over the at least one Josephson junction. However, in some implementations, the superconductor trace could extend over the at least one Josephson junction so long as the overlap was designed in a pre-defined geometry to provide a pre-designed capacitance per unit length. Accordingly, other embodiments are within the scope of the following claims.

What is claimed is:

1. A parametric traveling wave amplifier comprising:
a co-planar waveguide, wherein the co-planar waveguide comprises at least one Josephson junction interrupting a center trace of the co-planar waveguide; and
at least one shunt capacitor coupled to the co-planar waveguide, wherein each shunt capacitor of the at least one shunt capacitor comprises a corresponding superconductor trace extending over an upper surface of the center trace of the co-planar waveguide, wherein a gap separates the corresponding superconductor trace from the upper surface of the center trace, the gap comprising air or vacuum,
wherein the co-planar waveguide comprising the at least one Josephson junction and the at least one shunt capacitor establish a predefined overall impedance for the traveling wave parametric amplifier, and
wherein the overall impedance of the traveling wave parametric amplifier is a function of a height of the gap of each shunt capacitor.

2. The amplifier of claim 1, wherein the predefined overall impedance is about 50 ohms.

3. The amplifier of claim 1, wherein the corresponding superconductor trace extends over the center trace without also extending over the at least one Josephson junction.

4. The amplifier of claim 1, wherein the corresponding superconductor trace is elongated in a direction that is orthogonal to an elongated direction of the center trace.

5. The amplifier of claim 1, wherein the corresponding superconductor trace provides a corresponding air-bridge over the center trace.

6. The amplifier of claim 5, wherein the co-planar waveguide comprises a first ground plane extending along a first side of the center trace and comprises a second ground plane extending along a second side of the center trace, wherein a first end of the corresponding air-bridge is electrically connected to the first ground plane and a second end of the corresponding air-bridge is electrically connected to the second ground plane.

7. The amplifier of claim 1, wherein the predefined overall impedance of the traveling wave parametric amplifier is selected to match an impedance of a second component.

8. A parametric traveling wave amplifier comprising:
a first substrate;
a second substrate bonded to the first substrate;
a co-planar waveguide, wherein the co-planar waveguide comprises at least one Josephson junction interrupting a center trace of the co-planar waveguide; and
at least one shunt capacitor coupled to the co-planar waveguide, wherein each shunt capacitor of the at least one shunt capacitor comprises a corresponding superconductor trace extending over an upper surface of the center trace of the co-planar waveguide, wherein a gap separates the corresponding superconductor trace from the upper surface of the center trace, and
wherein the co-planar waveguide comprising the at least one Josephson junction and the at least one shunt capacitor establish a predefined overall impedance for the traveling wave parametric amplifier,
wherein the co-planar waveguide is arranged on an upper surface of the first substrate, and the corresponding superconductor trace is arranged on the second substrate.

9. The amplifier of claim 8, wherein the first substrate is bump bonded to the second substrate.

10. The amplifier of claim 9, wherein the co-planar waveguide comprises:
a first ground plane extending along a first side of the center trace; and
a second ground plane extending along a second side of the center trace, wherein the corresponding superconductor trace is electrically connected at a first end through a first bump bond to the first ground plane and is electrically connected at a second end through a second bump bond to the second ground plane.

11. A method of fabricating a parametric traveling wave amplifier, the method comprising:
providing a first substrate;
forming, on the first substrate, a co-planar waveguide comprising at least one Josephson junction interrupting a center trace of the co-planar waveguide;
fixing at least one superconductor trace above the co-planar waveguide to form at least one shunt capacitor, respectively, wherein each superconductor trace of the at least one shunt capacitor extends over an upper surface of the center trace of the co-planar waveguide and is separated from the upper surface by a corresponding gap, the gap comprising air or vacuum, and wherein the co-planar waveguide comprising the at least one Josephson junction and the at least one shunt capacitor establish a predefined overall impedance for the traveling wave parametric amplifier, and wherein, for each superconductor trace, fixing the at least one superconductor trace above the co-planar waveguide comprises:
- providing a layer of dielectric material over the co-planar waveguide;
- patterning the layer of dielectric material to form a pad of dielectric material and to reveal a portion of the co-planar waveguide;
- forming a superconductor layer on the pad of dielectric material and on the portion of the co-planar waveguide;
- patterning the superconductor layer to form the superconductor trace; and
- removing the pad of dielectric material to form the corresponding gap, wherein the superconductor trace provides a corresponding air-bridge over the center trace.

12. The method of claim 11, wherein the co-planar waveguide comprises a first ground plane extending along a first side of the center trace and a second ground plane extending along a second side of the center trace, and wherein patterning the superconductor layer to form the superconductor trace comprises forming a first electrical contact between a first end of the superconductor trace and the first ground plane and forming a second electrical contact between a second end of the superconductor trace and the second ground plane.

13. A method of fabricating a parametric traveling wave amplifier, the method comprising:
- providing a first substrate;
- forming, on the first substrate, a co-planar waveguide comprising at least one Josephson junction interrupting a center trace of the co-planar waveguide;
- fixing at least one superconductor trace above the co-planar waveguide to form at least one shunt capacitor, respectively, wherein each superconductor trace of the at least one shunt capacitor extends over an upper surface of the center trace of the co-planar waveguide and is separated from the upper surface by a corresponding gap, the gap comprising air or vacuum, and wherein the co-planar waveguide comprising the at least one Josephson junction and the at least one shunt capacitor establish a predefined overall impedance for the traveling wave parametric amplifier, and wherein, for each superconductor trace of the at least one superconductor trace, fixing the superconductor trace above the co-planar waveguide comprises:
- providing a second substrate comprising the superconductor trace; and
- bonding the second substrate to the first substrate so that the superconductor trace is positioned over the upper surface of the center trace and is separated from the upper surface by the corresponding gap.

14. The method of claim 13, comprising forming a second component on the first substrate, wherein the predefined overall impedance matches an impedance of the second component.

15. The method of claim 14, wherein the predefined impedance is about 50 ohms.

16. The method of claim 13, wherein the co-planar waveguide comprises a first ground plane extending along a first side of the center trace and a second ground plane extending along a second side of the center trace, and wherein bonding comprises:
- forming a first bump bond between a first end of the superconductor trace and the first ground plane; and
- forming a second bump bond between a second end of the superconductor trace and the second ground plane.

17. The method of claim 13, wherein each superconductor trace of the at least one superconductor trace is elongated in a direction that is orthogonal to an elongated direction of the center trace.

18. The method of claim 13, wherein each superconductor trace of the at least one superconductor trace extends over the center trace without also extending over the at least one Josephson junction.

* * * * *